(12) United States Patent
Torii

(10) Patent No.: US 8,507,971 B2
(45) Date of Patent: Aug. 13, 2013

(54) APPARATUS AND METHOD FOR A MEMORY ARRAY WITH SHALLOW TRENCH ISOLATION REGIONS BETWEEN BIT LINES FOR INCREASED PROCESS MARGINS

(75) Inventor: Satoshi Torii, Sunnyvale, CA (US)

(73) Assignee: Spansion LLC, Sunnyvale, CA (US)

(*) Notice: Subject to any disclaimer, the term of this patent is extended or adjusted under 35 U.S.C. 154(b) by 330 days.

(21) Appl. No.: 12/187,276

(22) Filed: Aug. 6, 2008

(65) Prior Publication Data
US 2009/0047762 A1    Feb. 19, 2009

Related U.S. Application Data

(62) Division of application No. 10/896,292, filed on Jul. 20, 2004, now Pat. No. 7,423,312.

(51) Int. Cl.
*H01L 29/76* (2006.01)
*H01L 31/119* (2006.01)

(52) U.S. Cl.
USPC ........... 257/324; 257/314; 257/315; 257/316; 257/405; 257/E21.657; 257/E21.658; 257/E21.681; 257/E21.682; 365/185.11; 438/257; 438/262; 438/776

(58) Field of Classification Search
USPC .......... 257/314, 315, 316, 324, 405, E21.657, 257/E21.658, E21.681, E21.682; 365/185.11; 438/257, 262, 776
See application file for complete search history.

(56) References Cited

U.S. PATENT DOCUMENTS

| | | | | |
|---|---|---|---|---|
| 6,211,012 B1* | 4/2001 | Lee et al. | ...... | 438/257 |
| 6,570,214 B1* | 5/2003 | Wu | ...... | 257/315 |
| 6,674,120 B2* | 1/2004 | Fujiwara | ...... | 257/324 |
| 6,744,105 B1* | 6/2004 | Chen et al. | ...... | 257/382 |
| 2003/0124845 A1* | 7/2003 | Trivedi | ...... | 438/682 |
| 2005/0148145 A1* | 7/2005 | Huang et al. | ...... | 438/295 |
| 2005/0156171 A1* | 7/2005 | Brask et al. | ...... | 257/72 |
| 2009/0103353 A1* | 4/2009 | Arimoto et al. | ...... | 365/149 |

* cited by examiner

*Primary Examiner* — Dao H Nguyen

(57) ABSTRACT

The present invention provides an apparatus and method for a non-volatile memory comprising at least one array of memory cells with shallow trench isolation (STI) regions between bit lines for increased process margins. Specifically, in one embodiment, each of the memory cells in the array of memory cells includes a source, a control gate, and a drain, and is capable of storing at least one bit. The array of memory cells further includes word lines that are coupled to control gates of memory cells. The word lines are arranged in rows in the array. In addition, the array comprises bit lines coupled to source and drains of memory cells. The bit lines are arranged in columns in the array. Also, the array comprises at least one row of bit line contacts for providing electrical conductivity to the bit lines. Further, the array comprises shallow trench isolation (STI) regions separating each of the bit lines along the row of bit line contacts.

12 Claims, 10 Drawing Sheets

APPARATUS AND METHOD FOR A MEMORY ARRAY WITH SHALLOW TRENCH ISOLATION REGIONS BETWEEN BIT LINES FOR INCREASED PROCESS MARGINS

RELATED APPLICATIONS

This Application is a Divisional of co-pending, commonly owned U.S. patent application Ser. No. 10/896,292, filed Jul. 20, 2004, entitled "Apparatus and Method for a Memory Array with Shallow Trench Isolation Regions Between Bit Lines for Increased Process Margins" to Torii, which is hereby incorporated herein by reference in its entirety.

TECHNICAL FIELD

The present invention relates to the field of microelectronic integrated circuits. Specifically, the present invention relates to dual bit flash memory devices.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash memory cell includes a source, drain, floating gate and control gate to which various voltages are applied to program the cell with a binary 1 or 0, or erase all of the cells as a block. The flash memory cell provides for nonvolatile data storage.

A typical configuration of a dual bit flash memory cell consists of an oxide-nitride-oxide (ONO) layer, within which the storage element is contained. The ONO layer is sandwiched between a control gate and a crystalline silicon semiconductor substrate. The substrate includes selectable source/drain regions.

In a dual bit flash memory cell, the flash memory cell stores data by holding charge in the ONO layer. The charge storage element within the ONO layer allows electrons to be stored on either side of the flash memory cell. That is, charge is stored within the ONO layer on either side of the mirror bit memory cell. As a result, the basic memory cell behaves as two independent conventional memory cells. In a typical dual bit flash memory cell, a program operation is done by injecting hot electrons into the ONO layer and an erase operation is done by injecting hot holes into the ONO layer.

A typical configuration of a floating gate flash memory cell consists of a thin, high-quality tunnel oxide layer sandwiched between a conducting polysilicon floating gate and a crystalline silicon semiconductor substrate. The tunnel oxide layer is typically composed of silicon oxide (SiO). The substrate includes a source region and a drain region that can be separated by an underlying channel region. A control gate is provided adjacent to the floating gate, and is separated by an interpoly dielectric. Typically, the interpoly dielectric can be composed of an oxide-nitride-oxide (ONO) structure.

The flash memory cell stores data by holding charge within the floating gate. In a write operation, charge can be placed on the floating gate through hot electron injection, or Fowler-Nordheim (F-N) tunneling. In addition, F-N tunneling can be typically used for erasing the flash memory cell through the removal of charge on the floating gate.

A typical configuration of an array of dual bit or floating gate flash memory cells includes rows and columns of flash memory cells. The array is supported by word lines and bit lines, wherein the word lines are coupled to gates of flash memory cells, and the bit lines are coupled to source and/or drains.

As the flash memory cells within an array are scaled to higher values, the size of structures within the array are decreased. For example, the bit lines become narrower and narrower within the array of memory cells. However, as the bit lines become narrower, misalignment issues between bit line contacts and the bit lines become more pronounced. As a result, the alignment margin when forming the contact to the bit lines becomes very small, thereby limiting the scaling increase of the array of memory cells.

In addition, in the conventional art, the bit lines can not be silicided, such that, a cobalt silicide (CoSi) layer cannot be formed on the bit lines. The CoSi layer provides for better conductivity, for example between the contact and the bit line. That is, the CoSi layer lowers the bit line contact resistance. However, in conventional manufacturing techniques forming the CoSi layer would electrically couple all the bit lines together in the array of memory cells. In that case, individual cells could not be isolated for reading or programming, since any bit line is coupled to all of the memory cells in the array.

As a remedy for the CoSi short, ONO layers are not removed between the word lines and in the bit line contact regions. As such, when a CoSi layer is deposited for the gates of the memory cells and for the source/drain regions of the periphery, the ONO acts to block CoSi formation between the bit lines of the array of memory cells. However, keeping the ONO layer between the word lines also can induce a leakage current. As a result, a leakage current would cause an entire column of memory cells to malfunction. In particular, with the leakage current, the total current read from a column of memory cells will include the current from the programmed memory cell being read and the leakage current. This may result in the programmed cell appearing to be erased.

DISCLOSURE OF THE INVENTION

The present invention provides an apparatus and method for a non-volatile memory comprising at least one array of memory cells with shallow trench isolation (STI) regions between bit lines for increased process margins. Specifically, in one embodiment, each of the memory cells in the array of memory cells includes a source, a control gate, and a drain, and is capable of storing at least one bit. The array of memory cells further includes word lines that are coupled to control gates of memory cells. The word lines are arranged in rows in the array. In addition, the array comprises bit lines coupled to source and drains of memory cells. The bit lines are arranged in columns in the array. Also, the array comprises at least one row of bit line contacts for providing electrical conductivity to the bit lines. Further, the array comprises shallow trench isolation (STI) regions separating each of the bit lines along the row of bit line contacts.

BEST MODES FOR CARRYING OUT THE INVENTION

Reference will now be made in detail to the preferred embodiments of the present invention, an apparatus and method for an array of memory cells comprising a plurality of shallow trench isolation (STI) regions between bit lines for promoting wider process margins. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses an apparatus and method for manufacturing an array of memory cells with wider process margins by introducing a plurality of STI regions between a plurality of bit lines. As a result, embodiments of the present invention can increase scaling of memory cells in the array by reducing the misalignment error when aligning bit line contacts to the plurality of bit lines. Moreover, embodiments of the present invention are capable of providing a significant increase in conductivity by reducing bit line contact resistance with the addition of cobalt silicide (CoSi) between the bit line contacts and the plurality of bit lines. Conventional manufacturing techniques did not form CoSi between the bit line contacts and the plurality of bit lines due to CoSi shorts between the bit lines.

Figure 1A:
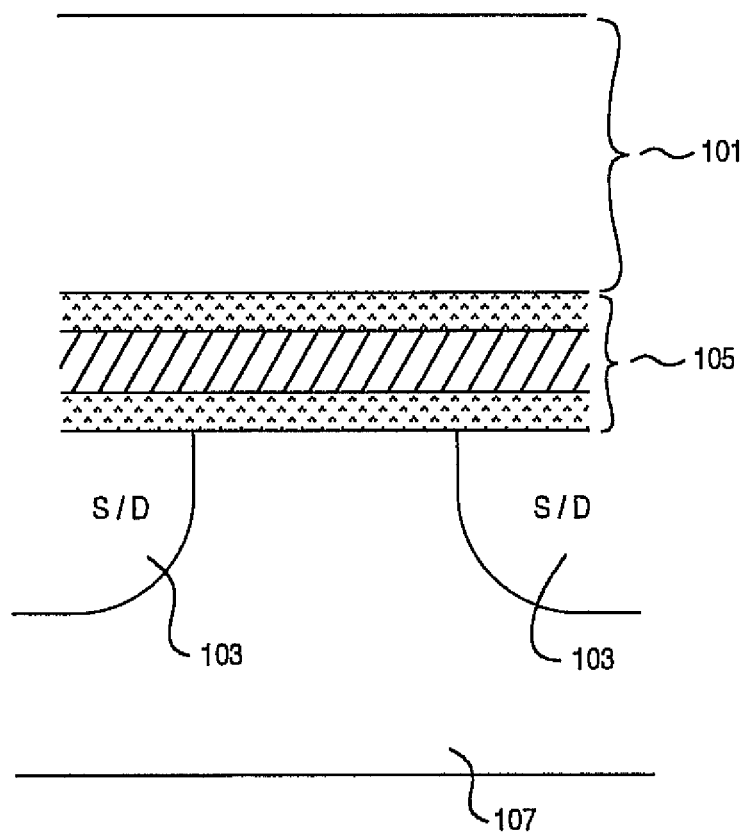
FIG. 1A is a diagram of a non-volatile dual bit flash memory cell, in accordance with one embodiment of the present invention.

Referring now to FIG. 1A, a typical configuration of a dual bit memory cell 100A, that is a flash memory cell, for implementation within an array of memory cells is shown, in accordance with one embodiment of the present invention. The dual bit memory cell 100A consists of an oxide-nitride-oxide (ONO) layer 105, within which the storage element is contained. That is, charge is stored within the ONO layer 105 on either side of the dual bit memory cell 100A. The ONO layer 105 is sandwiched between a control gate 101 and a crystalline silicon semiconductor substrate 107. The substrate 107 includes selectable source/drain regions 103.

In the dual bit memory cell 100A, the basic transistor is very different from conventional memory cells. Instead of the classical asymmetric transistor with a distinctly doped source and drain, the dual bit memory cell 100A uses a symmetric transistor with similarly doped source and drain regions 103.

As a result, the dual bit memory cell 100A comprises two distinct storage areas for programming and erasing. That is, the dual bit memory cell 100A can store one bit on the left side of the cell 100A and separately store another bit on the right side of the dual bit memory cell 100A. Once electrons are placed into one side of the storage element, for example on the left side of the cell, they remain trapped on that side. Similarly, once electrons are placed into the right side of the cell, they remain trapped to the right side. Consequently, read, program and erase operations are performed at full speed and power regardless of whether the left bit or right bit is used. As a result the basic dual bit memory cell 100A behaves as though it were two independent conventional memory cells. This architecture therefore offers twice the density of standard memory cells without sacrificing performance or reliability.

Figure 1B:
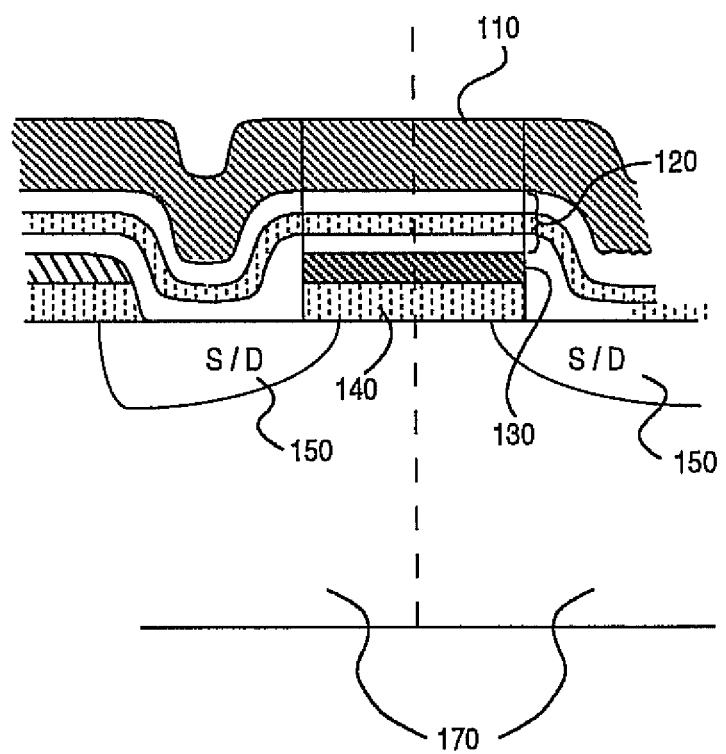
FIG. 1B is a diagram of a non-volatile floating gate flash memory cell, in accordance with one embodiment of the present invention.

While embodiments of the present invention are discussed within the context of the dual bit memory cell as described in FIG. 1A, other embodiments of the present invention are well suited to arrays of memory cells suitable for and supporting a wide range of flash memory cells, including floating gate flash memory, such as the one depicted in FIG. 1B.

Referring now to FIG. 1B, a typical configuration of a floating gate memory cell 100B, that is a flash memory cell, for implementation within an array of memory cells is shown, in accordance with one embodiment of the present invention. The floating gate memory cell 100B consists of a thin, high-quality tunnel oxide layer 140 sandwiched between a conducting polysilicon floating gate 130 and a crystalline silicon semiconductor substrate 170. The tunnel oxide layer 140 is typically composed of silicon oxide ($Si_xO_y$). The substrate 170 includes selectable source/drain regions 150 that can be separated by an underlying channel region. A control gate 110 is provided adjacent to the floating gate 130, and is separated by an interpoly dielectric 120. Typically, the interpoly dielectric 120 can be composed of an oxide-nitride-oxide (ONO) structure.

The floating gate memory cell 100B stores data by holding charge within the floating gate 130. In a write operation, charge can be placed on the floating gate 130 through hot electron injection, or Fowler-Nordheim (F-N) tunneling. In addition, F-N tunneling can be typically used for erasing the flash memory cell through the removal of charge on the floating gate.

Figure 2:
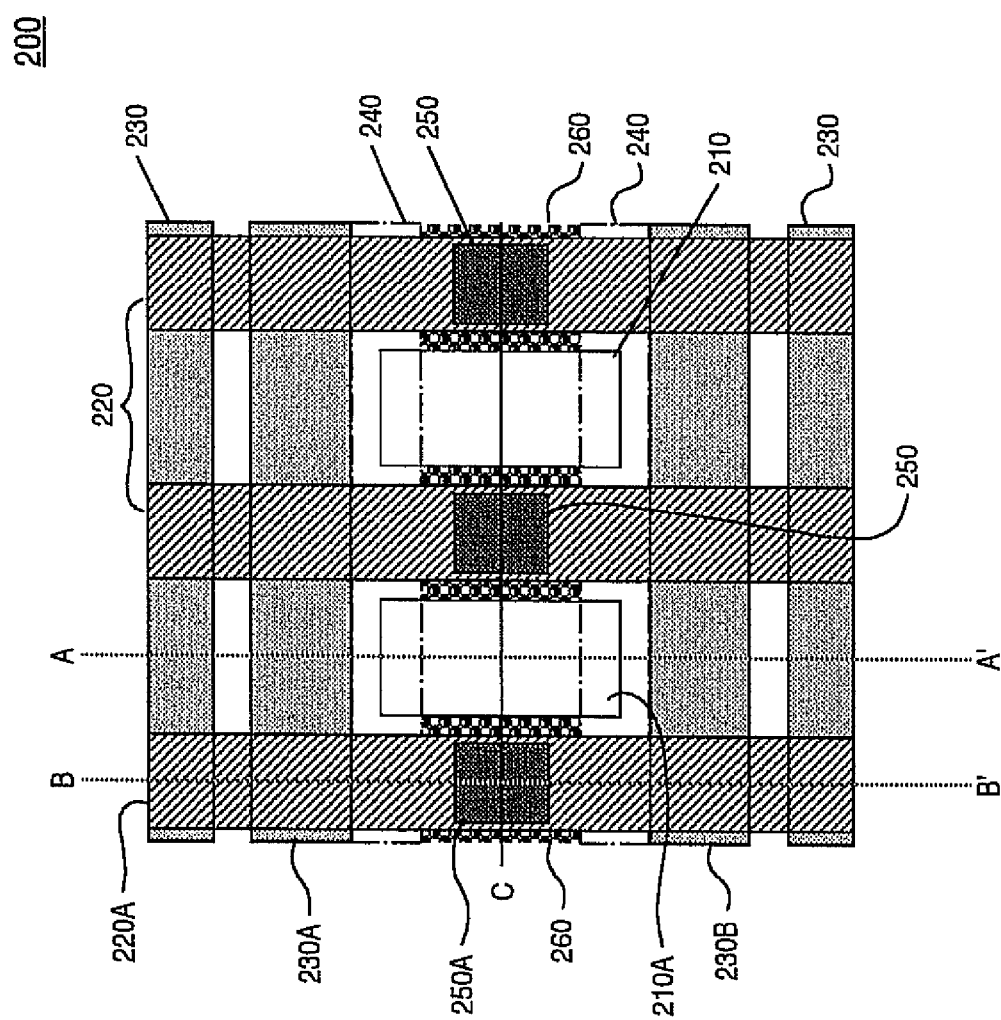
FIG. 2 is a plan view of a portion of an array of memory cells illustrating the formation of shallow trench isolation (STI) regions, in accordance with one embodiment of the present invention.

FIG. 2 is a plan view of a portion of an array 200 of memory cells that illustrates the formation of STI regions, in accordance with one embodiment of the present invention. The array 200 shown in FIG. 2 comprises a plurality of memory cells arranged in rows and columns. In one embodiment, the memory cells are dual bit, or dual bit, flash memory cells. Each of the memory cells comprise a source, a control gate, a drain, and is capable of storing at least one bit.

The array 200 of memory cells comprises a plurality of word lines 230. The plurality of word lines 230 is coupled to control gates of the memory cells. The plurality of word lines is arranged in rows in the array 200 of memory cells. The word lines are arranged on the surface of the array 300 in a substantially parallel formation. The word lines are identical in formation.

In addition, the array 200 of memory cells comprises a plurality of bit lines 220, including bit line 220A, coupled to source and drains of the memory cells in the array 200. The plurality of bit lines 220 is arranged in columns in the array 200. The plurality of bit lines 220 is formed in a substrate of the array 200 of memory cells.

The array 200 also comprises at least one row of bit line contacts 250. Each of the bit line contacts in the row of bit line contacts 250 provide for electrical conductivity to the plurality of bit lines 220. A region 260 is also shown comprising N+ implants that define a contact region. The N+ implants in the region 260 distinguish the bit lines 220 in the row of contacts to aid in the formation of the contacts in the row of contacts 250.

Also shown in FIG. 2 is a plurality of STI regions 210, including STI regions 210A and 210B. The plurality of STI regions 210 separate each of the plurality of bit lines 220. The plurality of STI regions 210 is arranged in a row that corresponds to a row of bit line contacts. The plurality of STI regions 210 promote a wider process margin when aligning contacts in a row of bit line contacts to the plurality of bit lines. As a result, due to the presence of the STI regions, narrower bit lines do not lead to greater misalignment. That is, the STI regions provide a buffer region that prevents conduction between bit lines even though the contacts may be misaligned with corresponding bit lines.

The dotted regions in FIG. 2 illustrate a plurality of side-wall spacers 240. The plurality of side-wall spacers 240 separate neighboring word lines 230A and 230B from the plurality of STI regions 250. In one embodiment, the side-wall spacers 240 are composed of silicon nitride (SiN).

Figure 3:
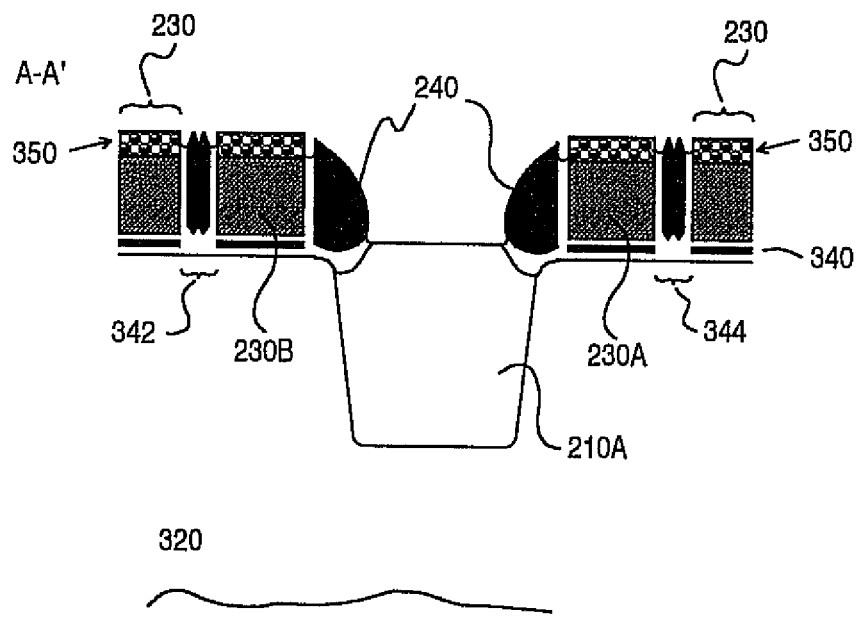
FIG. 3 is a cross sectional view of the array of memory cells in FIG. 2 taken along line A-A' illustrating an STI region, in accordance with one embodiment of the present invention.

FIG. 3 is a diagram 300 of a cross sectional view of the array of memory cells 200 in FIG. 2 taken along line A-A'. The diagram 300 illustrates an STI region 210A that is formed in a substrate 320, in accordance with one embodiment of the present invention. As shown in FIG. 3, the STI region 210A is separated from the neighboring word lines 230A and 230B by the side-wall spacers 240.

Most importantly, a layer of oxide-nitride-oxide (ONO) 340 is shown. Distinct from the conventional art, the ONO layer 340 is removed from the regions between word lines (e.g., in regions 342 and 344). This is advantageous since the ONO between the word lines promotes leakage currents. As such, with the removal of the ONO layer between the word lines (e.g., 342 and 230B), the leakage current is reduced or eliminated.

Additionally, the ONO layer 340 is removed over the STI region 210. With the addition of the STI region 210A, the ONO layer 340 is unnecessary to prevent bit line to bit line shorts due to the formation of a cobalt silicide (CoSi) layer 350, as shown by the bubbled region. As a result, the ONO layer 340 can be removed from the STI region, and a CoSi layer 350 can be formed on the word lines and over the bit lines (not shown) without any concern of bit line to bit line shorts due to the separation of the bit lines from the STI regions. The CoSi layer 350 is formed between the bit lines and the bit line contacts to reduce contact resistance, thereby increasing conductivity.

Figure 4:
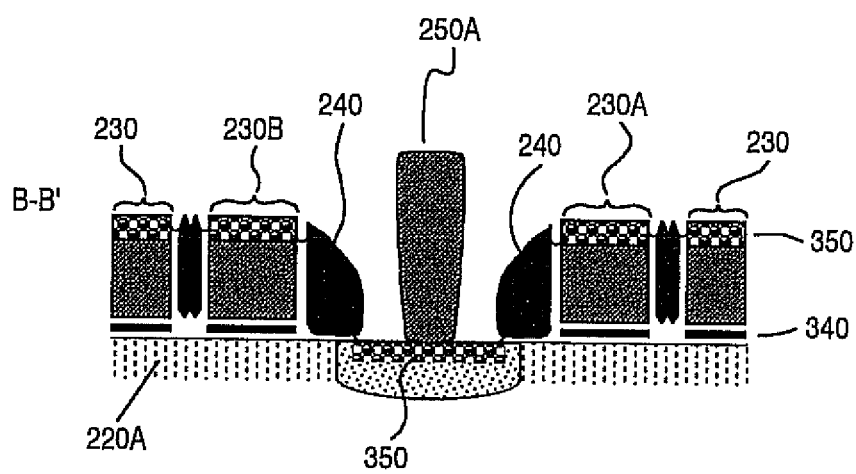
FIG. 4 is a cross sectional view of the array of memory cells in FIG. 2 taken along line B-B' illustrating the alignment of a contact with a bit line by using the STI region as an alignment mark, in accordance with one embodiment of the present invention.

FIG. 4 is a diagram 400 illustrating a cross sectional view of the array 200 of memory cells in FIG. 2 taken along line B-B', in accordance with one embodiment of the present invention. The diagram 400 illustrates the alignment of a contact 250A with a bit line 220A. In particular, the diagram 400 illustrates the formation of the CoSi layer 350 over the bit line 220A. In addition, FIG. 4 illustrates the absence of the ONO layer above the STI region, and as such, between the bit lines. As stated previously, the CoSi layer 350 is formed between the bit line 220A and the contact 250A to increase conductivity.

Figure 5A:
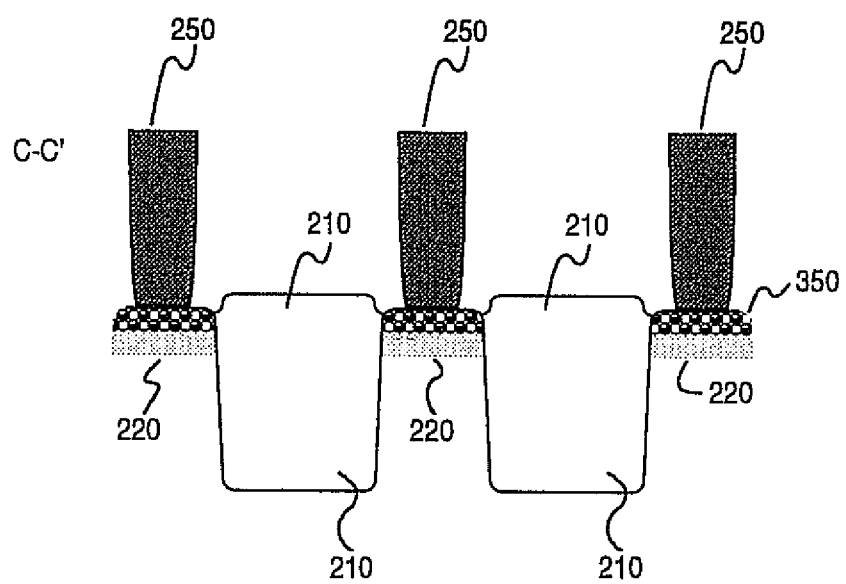
FIG. 5A is a cross sectional view of the array of memory cells in FIG. 2 taken along line C-C' illustrating an STI region, in accordance with one embodiment of the present invention.

FIG. 5A is a diagram 500A illustrating a cross sectional view of the array 200 of memory cells in FIG. 2 taken along line C-C', in accordance with one embodiment of the present invention. The diagram 500A illustrates the alignment of the row of contacts 250 with the plurality of bit lines 220.

In particular, the diagram 500A illustrates the separation of each of the plurality of bit lines 220 by a plurality of STI regions 210. The alignment of the contacts 250 is accomplished by using the STI regions 210, in one embodiment. As a result, when forming the contact region within which the contacts are formed, the contact region that defines the contacts 250 is centered between the STI regions 210 along one axis that parallels the rows in the array.

Figure 5B:
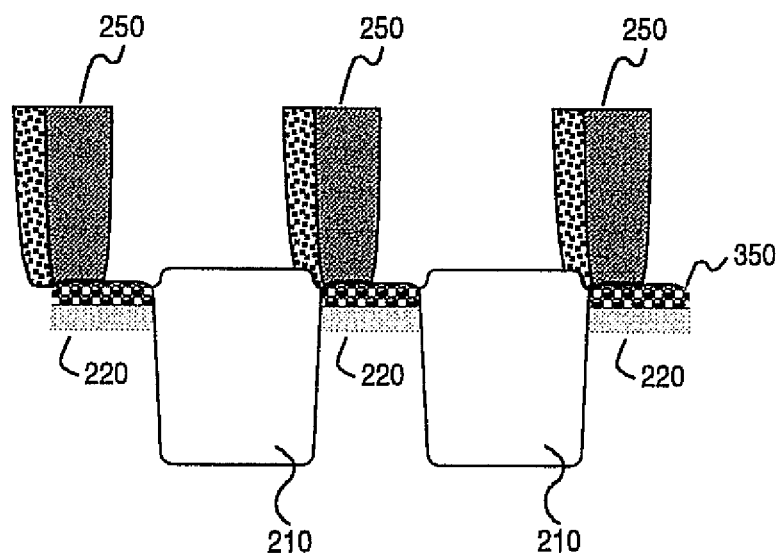
FIG. 5B is a cross sectional view of the array of memory cells in FIG. 2 illustrating the misalignment of contacts to a plurality of bit lines, and how the STI regions widen the process margin by preventing bit line to bit line shorts.

FIG. 5B is a diagram 500B illustrating a cross sectional view of the array 200 of memory cells in FIG. 2 illustrating the separation of bit lines 220 with STI regions 210. The cross sectional view in diagram 500B can be viewed along line C-C' for illustration purposes. As shown in FIG. 5B, even though the contacts 250 are misaligned with corresponding bit lines 220, the STI regions 210 allow for contact to bit line coupling without concern for bit line to bit line short. In conventional techniques without the STI regions 210, misalignment of the contacts 250 with the bit lines may introduce shorts between the bit lines 220, and shorts between the bit line 220 and the substrate 320.

On the other hand, the STI regions 210 in the present embodiment provide a good insulator to protect from bit line to bit line shorts due to contact misalignment. As a result, even though bit lines 220 may become narrower, a wider process margin is tolerated because the STI regions 210 in the present embodiment protect from bit line to bit line shorts due to misalignment between the contacts 250 and the plurality of bit lines 220.

Figure 6:
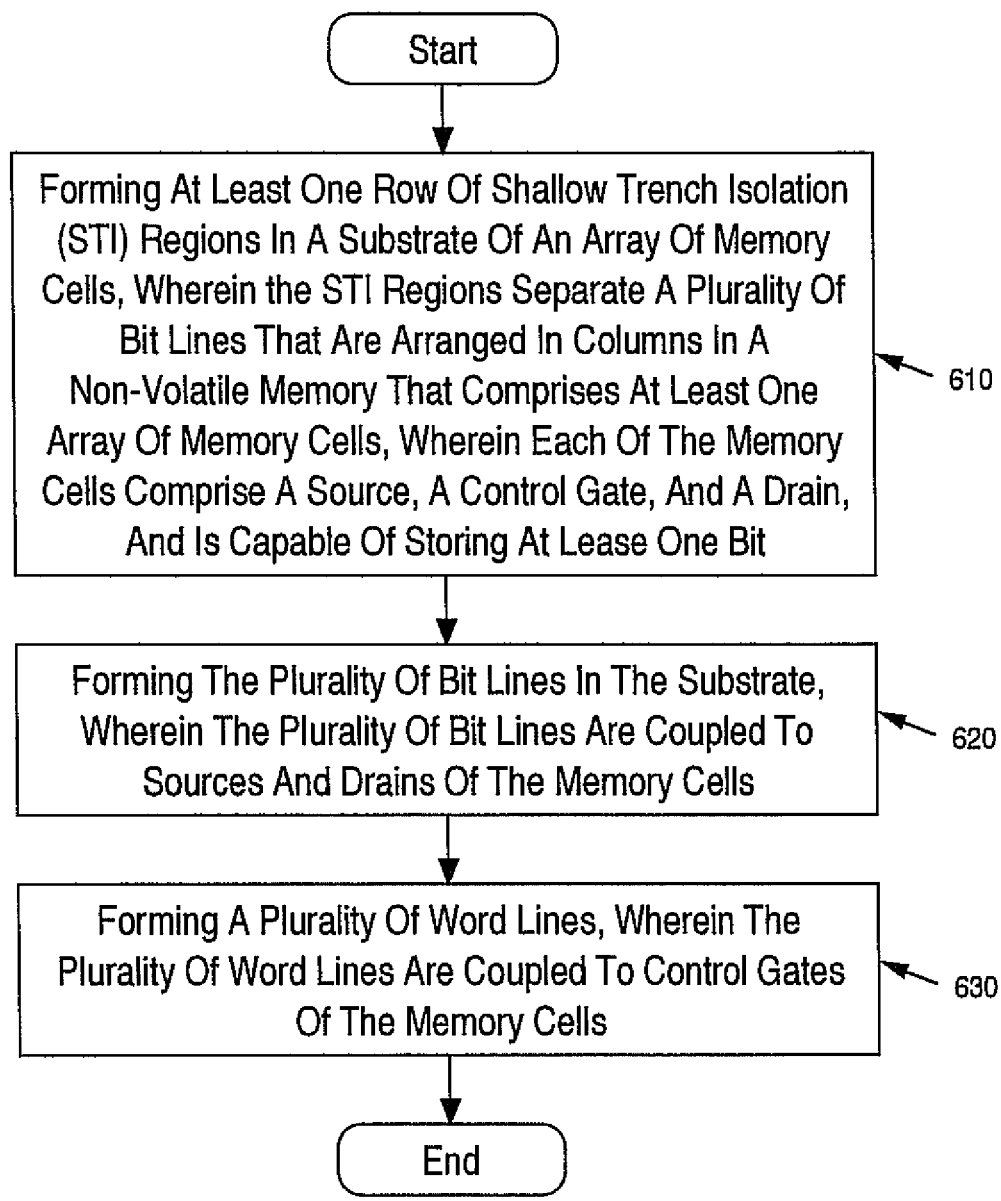
FIG. 6 is a flow chart illustrating steps in a method for manufacturing a non-volatile memory comprising an array of memory cells with STI regions between bit lines for increased process margins, in accordance with one embodiment of the present invention.

FIG. 6 is a flow chart 600 illustrating steps in a computer implemented method for manufacturing an array of memory cells having a wider process margin due to the presence of STI regions, in accordance with one embodiment of the present invention. Each memory cells of the array of non-volatile memory cells comprises a source, a control gate, and a drain, and is capable of storing at least one bit.

The present embodiment begins by forming at least one row of STI regions in a substrate, at 610. The STI regions separate a plurality of bit lines that are arranged in columns. The STI regions are arranged in a row, and correspond to a row of contacts that are electrically coupled to the plurality of bit lines.

In one embodiment, the STI regions are formed before the bit lines are implanted. As such, the STI regions can act as an alignment mark for the later formation of the bit lines. The silicon oxide (SiO) composition of the STI regions, of one embodiment, are distinct from the silicon substrate to provide a good alignment mark. The formation of the STI regions do not add any additional steps, since STI regions are formed at the same time for periphery devices that support the array of memory cells.

After formation of the STI regions, the present embodiment deposits the ONO layer. Removal of the ONO layer between the word lines and over the STI regions occurs at a later step.

At 620, the present embodiment continues by forming the plurality of bit lines in the substrate. A bit line mask is formed to outline the bit line implant. As such, the bit lines are implanted with impurities such that each of the bit lines can act as a source and/or a drain, depending on which memory cell is referenced. As a result, the plurality of bit lines coupled to sources and drains of the memory cells.

At 630, the present embodiment continues by forming a plurality of word lines, as in conventional processes. The plurality of word lines is coupled to control gates of the memory cells. As such, the present embodiment strips the bit line mask to reveal the ONO layer. Thereafter, a polysilicon composite is formed over the ONO layer. Then a word line mask is formed to outline the word lines. Thereafter the polysilicon composite is etched to form the word lines.

In one embodiment, STI can also be used as an alignment mark for the formation of the plurality of word lines. For instance, an alignment mark of STI is typically formed outside of the array of memory cells. The STI alignment mark is used to print the bit lines and the word lines. In another embodiment, the STI alignment mark is used for contact formations.

The present embodiment continues by forming a plurality of sidewall spacers between the STI regions and neighboring word lines that surround the row of STI regions. An insulator (e.g., silicon nitride, SiN) is deposited and etched anisotropically to form the sidewall spacers.

Thereafter, an $N^+$ implant is performed on the core region, the array of memory cells, in one embodiment. This step is conventionally performed for the periphery source and drain formation in periphery devices, and as such, does not add a step. The polysilicon of the word lines and the sidewall spacers (SiN) will block the $N^+$ implant. Also, the silicon oxide (SiO) of the STI regions will block $N^+$ formation. As such, the $N^+$ region is formed in the contact region to the bit lines along the row of STI regions (see regions 260 of FIG. 2). That is, the $N^+$ regions define the region for forming the contacts to electrically couple to the bit lines.

Figure 7:
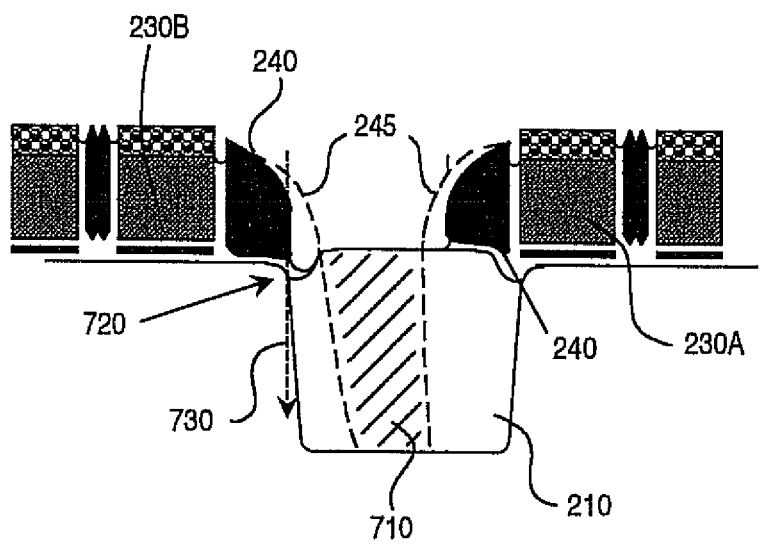
FIG. 7 is a cross sectional view of the array of memory cells in FIG. 2 illustrating the misalignment of word lines with a row of STI regions, in accordance with one embodiment of the present invention.

In one embodiment, the sidewall spacers are formed with sufficient thickness to prevent bit line to bit line shorts due to improper $N^+$ implants caused by misalignment. FIG. 7 is a diagram 700 illustrating a cross section of the array of memory cells in FIG. 2. The diagram 700 can be viewed along line A-A' for illustration purposes. FIG. 7 illustrates the gross misalignment of the word lines 230A and 230B to the STI region 210. Specifically, at point 720, the sidewall region 240 does not overlap with the STI region 210. As a result, a bit line to bit line short is created with a subsequently formed CoSi layer. On the other side, the word line 230A overlaps the STI region 210, which adversely affects device characteristics.

Also, the word line 230A encroaches upon the STI region 210, and the word line 230B is formed far from the STI region, such that the sidewall spacer 240 does not overlap with the STI region 210. As a result, subsequent formation of the $N^+$ layer will go to the substrate and cause bit line to bit line shorts along line 730.

FIG. 7 illustrates the thicker formation of sidewall spacers 240 along dotted lines 245. With thicker sidewall spacers 240 as shown by lines 245, the STI region can be smaller, as shown by shaded region 710, thus ensuring overlap of the sidewall spacers 240 with the STI regions 210. The thicker sidewall spacers 240 also prevent overlap between word lines and STI regions, and prevent the penetration of $N^+$ implant into the substrate 320.

Figure 8:
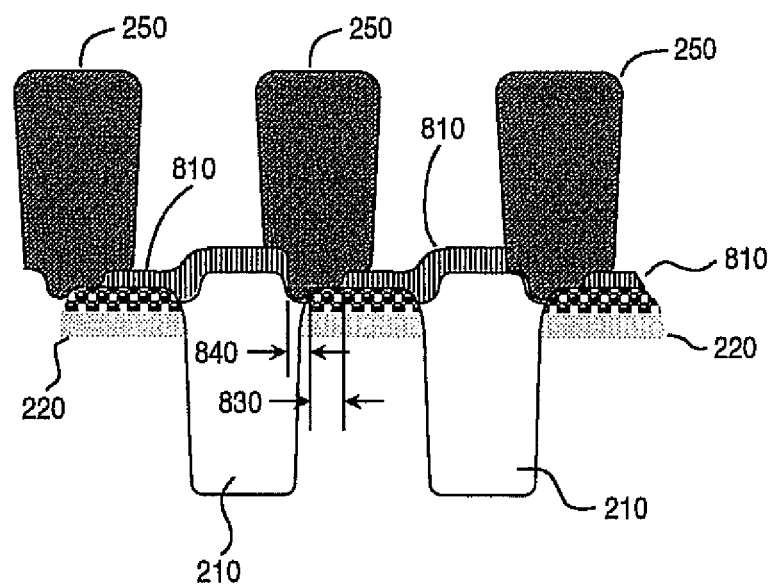
FIG. 8 is a cross sectional view of the array of memory cells in FIG. 2 illustrating the use of an etch stop layer to prevent overetching of the contact region, in accordance with one embodiment of the present invention.

FIG. 8 illustrates a diagram 800 of a cross section of the array of memory cells in FIG. 2, in accordance with one embodiment of the present invention, illustrating the formation of an etch stop layer (ESL) 810. The etch stop layer 810 prevents overetching of the contacts that are electrically coupled to the bit lines, due to misalignment. Without an ESL layer 810, the gas that is used to form the contact region through an interdielectric layer (IDL) to the bit line is permeable to the IDL and the STI region 210 that is composed typically of SiO. As a result, with misalignment, subsequent formation of the contact in the contact region will go down into the STI region 210 and expose the substrate 320 to the contact region due to overetching. This may result in a short between the bitline and substrate with the subsequent formation of the conductive contact.

The present embodiment addresses this misalignment issue of overetching. The present embodiment forms an ESL layer 810 over the STI regions 210 and the sidewall spacers to prevent over-etching of the substrate 320 due to misalignment. Then, the present embodiment forms the IDL layer. Thereafter, a first gas is used to etch contact regions through the IDL layer to the plurality of bit lines along a row of STI regions 210. The first gas is impermeable to the ESL 810, and as such, will not etch through the ESL 810 to the substrate 320 even though there is misalignment.

Then, the present embodiment continues by switching to another gas that is permeable to the ESL 810, but impermeable to the IDL layer or STI region. As such, the ESL layer 810 is etched through the contact region to the bit lines, but does not etch through the STI region 210 to the substrate 320, thus preventing overetching and shorts between the bit lines 220 through the substrate 320. As a result, the contact 250 is able to electrically couple with the bit line 220 along a thickness 830. Also, the contact 250 is stopped at the STI region 210 along a thickness 840 due to the ESL layer 810.

The preferred embodiment of the present invention, an apparatus and method for manufacturing an array of memory cells comprising a plurality of shallow trench isolation (STI) regions between bit lines for promoting wider process margins, is thus described. While the present invention has been described in particular embodiments, it should be appreciated that the present invention should not be construed as limited by such embodiments, but rather construed according to the below claims.

What is claimed is:

1. In a non-volatile memory comprising at least one array of memory cells, wherein each of the memory cells comprise a source, a control gate, and a drain, and are capable of storing at least one bit, a method for manufacturing said array of memory cells, comprising:

forming at least one row of shallow trench isolation (STI) regions in a substrate of said array of memory cells, said STI regions separating a plurality of bit lines arranged in columns;

forming said plurality of bit lines in said substrate, said plurality of bit lines coupled to sources and drains of said memory cells;

forming a plurality of word lines, said plurality of word lines coupled to control gates of said memory cells wherein an ONO layer is formed between said control gates and said substrate wherein said plurality of word lines are separated by SiN sidewall spacers that overlap a downward sloped portion at the left and right sides of a top surface of said STI region wherein the bottom of the downward sloped portion at the left and right sides of a top surface of said STI region contact top corners of a portion of said substrate; and forming a cobalt silicide (COSI) layer between bit line contacts and said plurality of bit lines in at least one row of contacts.

2. The method of claim 1, further comprising:
forming a plurality of sidewall spacers between said STI regions and neighboring word lines; and
forming an N+ region defining contact areas for electrically accessing said plurality of bit lines.

3. The method of claim 2, further comprising:
forming said sidewall spacers with sufficient thickness to overlap said STI regions to prevent bit line shorts due to improper N+ implants from misalignment.

4. The method of claim 2, further comprising:
forming an etch stop layer (ESL) over said STI regions and said sidewall spacers to prevent over-etching of said substrate due to misalignment;
forming an inter-dielectric layer (IDL);
etching contact regions through said IDL to said plurality of bit lines along said at least one row of STI regions with a first gas that is impermeable to said ESL; and
etching said ESL layer through said contact regions to bit lines with a second gas that is impermeable to said IDL and STI.

5. The method of claim 2, wherein said forming an N+ layer is performed simultaneously over periphery devices supporting said array of memory cells.

6. The method of claim 1, wherein said forming said plurality of bit lines further comprises:
using STI as an alignment mark for formation of said plurality of word lines.

7. The method of claim 1, wherein said forming said plurality of bit lines further comprises:
using STI as an and alignment mark for formation of said plurality of word lines.

8. The method of claim 1, further comprising:
using STI as an alignment mark for the formation of a plurality of contacts that are electrically coupled to said plurality of bit lines.

9. The method of claim 1, further comprising:
after said forming at least one row of STI regions, depositing an oxide-nitride-oxide (ONO) layer; and
removing portions of said ONO layer between said plurality of word lines and above said STI regions.

10. The method of claim 1, further comprising:
forming a cobalt silicide (CoSi) layer, wherein said CoSi layer is formed over said plurality of bit lines and said plurality of word lines.

11. The method of claim 1, wherein said forming at least one row of STI regions is performed simultaneously over periphery devices supporting said array of memory cells.

12. The method of claim 1, further comprising:
forming at least one row of bit line contacts corresponding to said at least one row of STI regions electrically coupled to said plurality of lines.

* * * * *